(12) United States Patent
Tetsuka et al.

(10) Patent No.: US 7,908,104 B2
(45) Date of Patent: Mar. 15, 2011

(54) PLASMA PROCESSING APPARATUS AND METHOD FOR DETECTING STATUS OF SAID APPARATUS

(75) Inventors: Tsutomu Tetsuka, Kasumigaura (JP); Naoshi Itabashi, Hachioji (JP); Atsushi Itou, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 244 days.

(21) Appl. No.: 12/025,095

(22) Filed: Feb. 4, 2008

(65) Prior Publication Data
US 2009/0105980 A1    Apr. 23, 2009

(30) Foreign Application Priority Data
Oct. 19, 2007  (JP) .................................. 2007-272396

(51) Int. Cl.
*G01R 23/16*  (2006.01)
(52) U.S. Cl. ...... 702/76; 702/117; 356/316; 315/111.41; 156/345.35; 156/345.48; 156/345.51; 118/723 R; 118/723 VE
(58) Field of Classification Search .............. 118/723 R, 118/723 VE; 156/345.35, 345.48, 345.51; 315/111.41; 356/316; 702/60, 76, 117
See application file for complete search history.

(56) References Cited

U.S. PATENT DOCUMENTS
6,339,297 B1 *  1/2002  Sugai et al. ............. 315/111.21
2007/0006972 A1 *  1/2007  Piptone et al. ........... 156/345.48

FOREIGN PATENT DOCUMENTS
| JP | 2000-340550 | 12/2000 |
| JP | 2002-294460 | 10/2002 |
| JP | 2005-158684 | 6/2005 |
| JP | 2005-228727 | 8/2005 |

* cited by examiner

*Primary Examiner* — Eliseo Ramos Feliciano
*Assistant Examiner* — Elias Desta
(74) *Attorney, Agent, or Firm* — Antonelli, Terry, Stout & Kraus, LLP.

(57) ABSTRACT

The invention provides a method for detecting and managing the status of a plasma processing apparatus with high sensitivity so as to enable long-term stable processing. In a plasma processing apparatus comprising a vacuum processing chamber 10, a plasma generating high frequency power supply 16, and a measurement device unit 3 for estimating the status of the apparatus via reflected waves 54 of the incident waves 53 reflected from the processing apparatus including a waveform generator 32, a VCO 33, a directional coupler 34, a detector 35 and a measurement data processing unit 36, frequency-swept high frequency waves 53 for measurement are introduced to the processing chamber where no plasma discharge is performed, so as to monitor the change of absorption spectrum frequency of the reflected waves 54 to thereby monitor the change in status of the processing apparatus.

12 Claims, 9 Drawing Sheets

FIG. 6

| δ fa max=0.1GHz fa0=0.22GHz | | | δ fb max=0.2GHz fb0=0.35GHz | | |
|---|---|---|---|---|---|
| t | fa | δ fa | t | fb | δ fb |
| t1 | 0.23 | 0.01 | t1 | 0.35 | 0.00 |
| t2 | 0.25 | 0.03 | t2 | 0.37 | 0.02 |
| t3 | 0.31 | 0.09 | t3 | 0.36 | 0.01 |
| t4 | 0.33 | 0.11 | t4 | 0.38 | 0.03 |
| t5 | 0.42 | 0.20 | t5 | 0.40 | 0.05 |
| t6 | - | - | t6 | - | - |
| t7 | - | - | t7 | - | - |
| t8 | - | - | t8 | | |

PLASMA PROCESSING APPARATUS AND METHOD FOR DETECTING STATUS OF SAID APPARATUS

The present application is based on and claims priority of Japanese patent application No. 2007-272396 filed on Oct. 19, 2007, the entire contents of which are hereby incorporated by reference.

BACKGROUND OF THE INVENTION

1. Field of the Invention

The present invention relates to a plasma processing apparatus capable of having its status detected and a method for detecting the status of a plasma processing apparatus, and more specifically, relates to a plasma processing apparatus and a method for detecting the status of a plasma processing apparatus capable of having the status of the apparatus such as defect or individual variability of the apparatus detected without performing plasma discharge.

2. Description of the Related Art

Recently, plasma processing apparatuses using plasma for processing are used widely in the processes for manufacturing semiconductor devices and flat panel displays. In plasma processing apparatuses, reactive gases or depositing gases selected according to the object of the process are discharged via microwaves or high frequency waves, for example, so as to process samples. In such apparatuses, the electrons, ions and activated radicals having relatively high energy generated by discharge cause the components in the interior of the processing chamber to be consumed or cause reaction products to be deposited on the inner walls of the processing chamber, which leads to variation of the processing properties. Especially, in manufacturing high-accuracy devices, the variation of processing properties causes serious problems that may lead to deterioration of yield of the products or creation of defective products.

Thus, measures have been taken generally to control the processing status of the plasma processing apparatus highly accurately, or to monitor the status of the generated plasma directly in order to stabilize processing properties. According to conventional techniques for stabilizing the status of plasma, the defect of the apparatus is determined based on the amplitude and phase of reflection coefficient of the high frequency waves for generating plasma reflected from the plasma (refer for example to Japanese Patent Application Laid-Open Publication No. 2002-294460, hereinafter referred to as patent document 1).

Furthermore, a network analyzer is used to measure the s-parameter of a plasma-generating high frequency power supply and matching unit, and based on the information on the measured s-parameter, the matching of the high frequency waves is adjusted so as to control the plasma processing status (refer for example to Japanese Patent Application Laid-Open Publication No. 2005-158684, hereinafter referred to as patent document 2).

Further, a method for monitoring the change in plasma density using a plasma absorption method which is one method for measuring plasma density is proposed to directly monitor the plasma status during processing. The plasma absorption method includes supplying high frequency power to the plasma while changing frequency, and computing the plasma density from the frequency in which the reflected power becomes minimum. This method utilizes the fact that the frequency in which plasma waves are excited depends on the plasma density, and plasma waves are resonantly-excited in the plasma when the reflected power becomes minimum (refer for example to Japanese Patent Application Laid-Open Publication No. 2000-340550, hereinafter referred to as patent document 3).

Similar to the prior art disclosed in patent document 3, a method is proposed to measure the plasma density using an absorption probe method, wherein a network analyzer is used to detect the frequency in which the imaginary part of the reflecting coefficient from the plasma zero-crosses, by which the plasma density can be computed with high accuracy (refer for example to Japanese Patent Application Laid-Open Publication No. 2005-228727, hereinafter referred to as patent document 4).

However, according to prior art plasma processing apparatuses, the control of the apparatus or the determination of defect of the apparatus is always performed based on the data detecting the status of the apparatus during plasma discharge, and since the detected data is influenced by the large number of parameters of the apparatus related to the discharge status, such as gas pressure, processing gas flow rate, processing chamber temperature and deposits on the inner walls of the processing chamber, it is difficult to determine the status of the apparatus accurately.

If the amplitude data and phase data of the reflection coefficient of the high frequency wave used for generating plasma are used to control the apparatus, the obtained information related to the status of the apparatus is only effective for limited portions of the apparatus, since these data mainly reflect the matching status of the high frequency waves from the high frequency power supply.

When the prior art plasma absorption probe method is used to measure the plasma status such as plasma density and to perform control of the apparatus, it is necessary to arrange a sensor for measurement within the plasma-generating region of the chamber, but if the sensor is damaged by the reactive processing gas or if reaction products are deposited on the sensor, particles may contaminate the object being processed.

Moreover, according to the method for controlling the status of the apparatus while measuring data during plasma-generated processing, the manufacturing line must be stopped when the defect of the apparatus is detected, and the manufacturing is stopped during the period of time when the defect of the apparatus is coped with, which may lead to a great loss.

SUMMARY OF THE INVENTION

The present invention aims at solving the problems of the prior art described above, and the object of the present invention is to provide a plasma processing apparatus and a method for detecting the status of a plasma processing apparatus capable of detecting the status of the apparatus with high sensitivity prior to starting the manufacturing process, without having to generate plasma and without having to place a sensor for measurement in the plasma processing chamber.

In order to solve the problems of the prior art, a first aspect of the present invention provides a plasma processing apparatus having a vacuum processing chamber and a plasma generating means for generating plasma in the vacuum processing chamber for subjecting a sample placed in the vacuum processing chamber to plasma processing, comprising a frequency spectrum measurement means for radiating a frequency-swept electromagnetic wave having weak power so as not to cause plasma discharge in the vacuum processing chamber having no plasma generated, and measuring the frequency spectrum of a reflected power of an electromagnetic wave reflected from the vacuum processing chamber.

Further, the plasma processing apparatus according to the first aspect of the present invention characterizes in that the weak electromagnetic wave for measurement is connected via a coupling circuit to a high frequency transmission unit for generating plasma, and the weak electromagnetic wave is supplied via the high frequency transmission unit to the vacuum processing chamber.

Moreover, the plasma processing apparatus according to the first aspect of the present invention characterizes in that the weak electromagnetic wave for measurement is connected via a coupling circuit to a high frequency transmission unit applied to the sample, and the weak electromagnetic wave is radiated through the high frequency transmission unit to the vacuum reactor.

The plasma processing apparatus according to the present invention characterizes in that the frequency spectrum pattern of the reflected power measured by the frequency spectrum measurement means for reflected power is used as a reference of the change in status of the plasma processing apparatus unique to the plasma processing apparatus, and that the defect of the plasma processing apparatus is determined and displayed based on the difference between the reference and the measured value.

The plasma processing apparatus according to the present invention characterizes in that out of a plurality of frequency values in which a reflected power of the frequency spectrum data of the reflected power becomes minimum, at least one frequency value is stored as a reference of the change in status of the plasma processing apparatus unique to the plasma processing apparatus, and the change in status or defect of the plasma processing apparatus is determined based on the difference between a newly-measured frequency spectrum data and the stored frequency spectrum data.

The plasma processing apparatus according to the present invention characterizes in that the defect of an individual variability between the present plasma processing apparatus and another plasma processing apparatus is determined by comparing and detecting the difference between the data stored as reference of the status of the plasma processing apparatus unique to the present plasma processing apparatus and the data measured in the another plasma processing apparatus.

The plasma processing apparatus according to the present invention characterizes in that the frequency spectrum measurement means for reflected power generates a frequency-swept weak electromagnetic wave using a voltage control oscillator (VCO).

The plasma processing apparatus according to the present invention characterizes in that the frequency spectrum measurement means for reflected power utilizes a network analyzer.

The plasma processing apparatus according to the present invention characterizes in that data of a frequency spectrum pattern or a plurality of frequency values in which reflected power becomes minimum of the reflected power measured in advance by the frequency spectrum measurement means while creating a state in which a component of the plasma processing apparatus is consumed or is provided with a predicted tolerance variation are stored, and the change in pattern of a newly-measured data is verified with the stored data to specify a component causing the change in status of the apparatus.

The plasma processing apparatus according to the present invention characterizes in acquiring data of a frequency spectrum pattern or a plurality of frequency values in which reflected power becomes minimum of the reflected power measured in advance by the frequency spectrum measurement means either arbitrarily via control from a control unit of the plasma processing apparatus or periodically, and stores the acquired data as database.

The plasma processing apparatus according to the present invention characterizes in that a connector of the high frequency transmission unit connecting the high frequency power supply for generating plasma and the vacuum processing chamber of the plasma processing apparatus is disengaged temporarily, and via the connector portion, a weak electromagnetic wave for measurement is radiated into the vacuum processing chamber or to the high frequency power supply.

The plasma processing apparatus according to the present invention characterizes in that a connector of the high frequency transmission unit connecting the high frequency power supply for applying high frequency waves to the sample to be processed placed in the plasma processing chamber and the vacuum processing chamber is disengaged temporarily, and via the connector portion, a weak electromagnetic wave for measurement is radiated into the vacuum processing chamber or to the high frequency power supply.

The effects of the present invention are as follows.

According to the plasma processing apparatus of the present invention, the change in status of the plasma processing apparatus can be monitored highly accurately and arbitrarily prior to performing plasma processing without having to generate plasma. Furthermore, by monitoring the resonant frequency of the frequency spectrum of reflected power, not only the status of the plasma processing apparatus can be detected highly sensitively, but also the defective location of the apparatus can be identified by the frequency place in which the difference has been detected. Moreover, by storing the frequency spectrum pattern of reflected power as data showing the status of the plasma processing apparatus unique to the present plasma processing apparatus, the variability over time of the status of the plasma processing apparatus can be managed, and in case of defect of the plasma processing apparatus, the cause of such defect can be identified more easily.

The present invention is especially effective in detecting and monitoring the status of the plasma processing apparatus used for manufacturing semiconductors so as to enable stable processing to be performed for a long period of time.

BRIEF DESCRIPTION OF THE DRAWINGS

FIG. 6 is an explanatory view showing one example of a measurement result database according to the present invention;

DETAILED DESCRIPTION OF THE PREFERRED EMBODIMENTS

Now, the preferred embodiments of the present invention will be described with reference to FIGS. 1 to 10.

Embodiment 1

Figure 1:
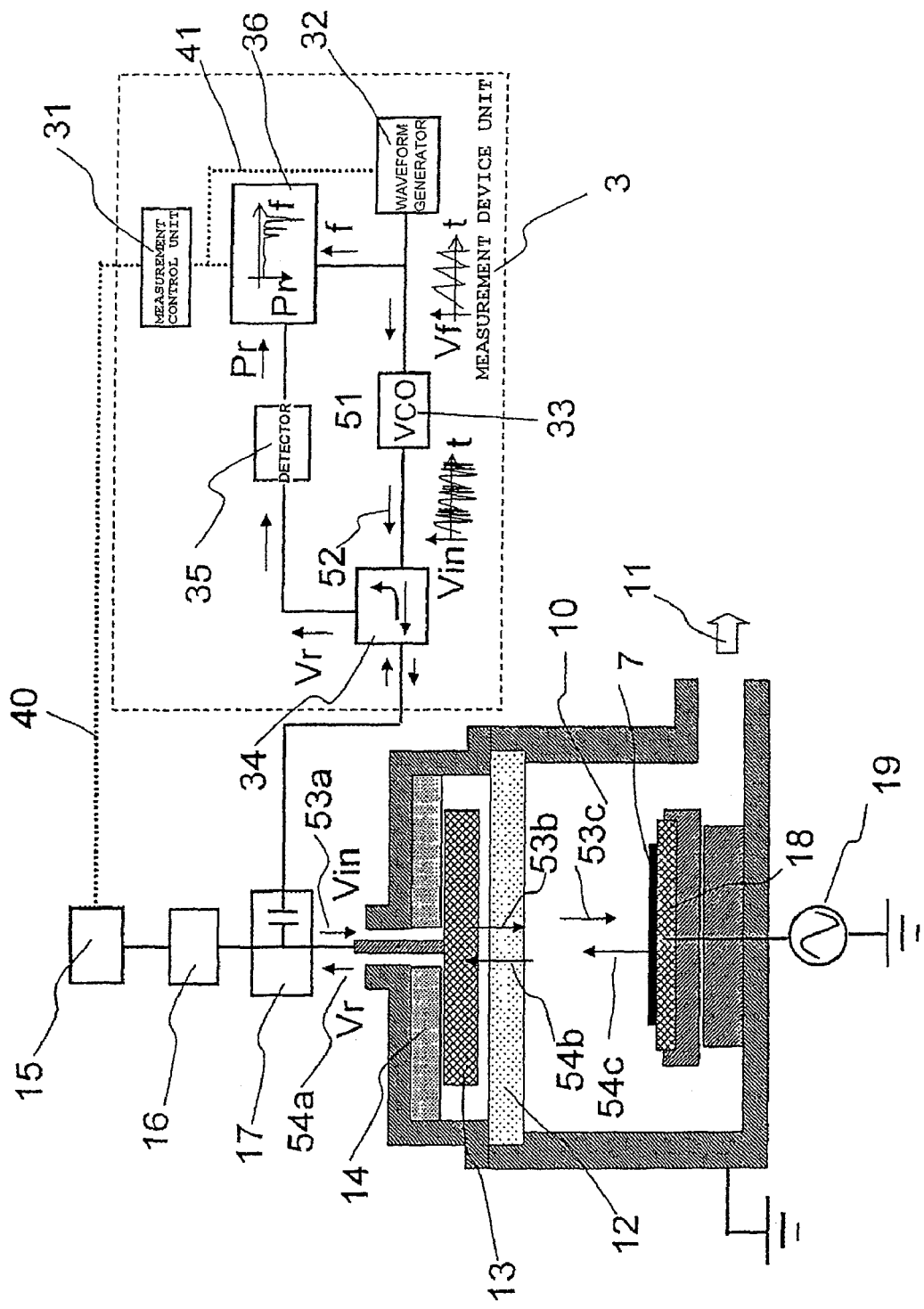
FIG. 1 is an explanatory view showing the outline of an arrangement of a plasma processing apparatus according to a first embodiment of the present invention.

With reference to FIG. 1, the outline of the arrangement of a plasma processing apparatus according to a first embodiment of the present invention will be described. The plasma processing apparatus of the present embodiment is a parallel plate plasma processing apparatus using microwaves or high frequency waves.

The plasma processing apparatus includes a vacuum processing chamber 10 formed within a casing (vacuum reactor), a vacuum means 11, a vacuum window 12, a high frequency electrode (high frequency transmission unit) 13, an insulating support member 14, a processing apparatus control unit 15, a plasma-generating high frequency power supply 16, a high frequency matching unit 17, an electrostatic chuck (attraction electrode) 18, an RF bias high frequency power supply 19 and a measurement device unit (frequency spectrum measuring means) 3.

A substrate to be processed (wafer) 7 is attracted and held on the electrostatic chuck 18. A connector not shown can be arranged between the plasma-generating power supply 16 and the high frequency matching unit 17.

The measurement device unit 3 includes a measurement control unit (means for detecting defect or the like of the plasma processing apparatus) 31, a low-frequency waveform generator (saw-tooth wave generator) 32, a voltage control oscillator (VCO) 33, a directional coupler 34, a detector 35, a measurement data processing unit 36, and a data recording means (database), a display means and an input means for inputting frequency spectrum patterns from the exterior, which are not shown. The waveform generator 32 and the voltage control oscillator 33 constitute an electromagnetic wave generating means for sweeping frequency and generating incident power.

The measurement device unit 3 radiates frequency-swept electromagnetic waves weak enough not to cause plasma discharge into the vacuum processing chamber of the plasma processing apparatus having no plasma generated therein, and functions as a means for measuring the frequency spectrum of the reflected power of the electromagnetic waves reflected from the vacuum reactor.

The measurement control unit 31 is a means for controlling the operation of the measurement device unit 3. Further, the measurement control unit 31 includes a memory function for storing the frequency spectrum, and a comparison function for comparing the measured frequency spectrum with a frequency spectrum specific to the plasma processing apparatus and determining whether the difference falls within a predetermined range.

The waveform generator 32 is an oscillator in which the output waveform varies periodically, which is formed for example of a saw-tooth wave oscillator.

The voltage control oscillator 33 is a means for outputting high frequency waves having an output frequency proportional to the input voltage, and outputs high frequency waves sweeping the frequency proportional to the input when saw-tooth wave voltage is applied.

The directional coupler 34 outputs the input signals from a first terminal to a second terminal, and outputs the input signals from the second terminal to a third terminal.

The detector 35 is a reflected power detecting means for detecting the reflected wave power Pr of the reflected waves Vr coming from the directional coupler 34.

The measurement data processing unit 36 creates a spectrum pattern of the reflected power frequency spectrum based on the reflected wave power detected by the detector 35 and the frequency.

The vacuum processing chamber 10 in which plasma is generated for processing has a casing formed of metal such as aluminum or stainless steel, and the chamber 10 is connected to a vacuum means 11 for evacuating the interior of the chamber. A wafer 7 which is the sample to be processed is held by electrostatic force to a lower area of the vacuum processing chamber 10 via an electrostatic chuck 18. A high frequency power supply (RF bias high frequency power supply) 19 is connected to the wafer 7 for applying high frequency voltage to the wafer 7 for accelerating the ions toward the wafer during plasma processing. The details of the feeders of the electrostatic chuck 18 and the high frequency power supply 19 or the details of the cooling mechanism of the wafer 7 are not shown in the drawing. The supporting unit of the wafer 7, that is, the electrostatic chuck 18, is composed of various components, such as a cooling mechanism, a focus ring and a pusher pin.

A dielectric vacuum window 12 is arranged at the upper portion of the vacuum processing chamber 10 for introducing high frequency waves for generating plasma. The output from a plasma-generating high frequency power supply 16 is supplied via a matching unit 17 and radiated through a high frequency electrode 13 into the processing chamber as high frequency waves for generating plasma. The high frequency electrode 13 is fixed via an insulating supporting member 14 to the metallic casing using screws for example.

The measurement device unit 3 of FIG. 1 outputs an order to the measurement control unit 31 to execute measurement at a timing where no plasma is discharged based on measurement control signals 40 output from a processing apparatus control unit 15 for controlling the plasma processing apparatus, and transmits the result of the measurement, such as defect signals of the plasma processing apparatus, to the processing apparatus control unit 15.

A general-purpose network analyzer can be used in the arrangement for generating high frequency waves for measurement and detecting the same, but an example of a measurement device unit having a low-cost and simple configuration is shown in the illustrated measurement device unit 3. The generation of high frequency waves having a time-modulated frequency which is required for the present measurement can be acquired by inputting the saw-tooth waves Vf 51 for example from the low-frequency waveform generator 32 to the voltage control oscillator (VCO) 33, by which high frequency waves Vin 52 having frequency that varies in proportion to the voltage of the saw-tooth waves Vf 51, that is, frequency-swept high frequency waves, can be obtained.

The frequency f (Hz) of the high frequency waves being used is determined in the following manner. Since it is necessary to induce resonance in the high frequency transmission system and processing chamber of a general plasma processing apparatus, the basic resonance frequency fc (Hz) is computed as follows, since resonance is induced when the transmission path length and processing chamber length L(m) equals ½ the wavelength λ of the high frequency waves:

resonance frequency $fc = (3 \times 10E8/2)/L$

Therefore, when the characteristic length L of the plasma processing apparatus is set so that L=0.5 (m), the resonance frequency fc=300 (MHz).

As a result, the basic resonance frequency within the transmission system and the processing chamber of the plasma processing apparatus is estimated to be approximately 300 (MHz). However, since a large number of components are assembled to the interior of the plasma processing apparatus, such as the high frequency electrode 13 and the electrode supporting member 14, resonance induced by the various components occurs in addition to the resonance induced by the above-mentioned basic resonance frequency. The frequency range of resonance depends on the structure of the plasma processing apparatus and the relevant components, but it has been discovered according to the result of measurement performed by the present embodiment that it is sufficient to measure the frequency range of fc=30 MHz to 3 GHz with the basic frequency set at the center. Thus, it is necessary to use a combination of elements of appropriate frequency ranges so that the output frequency of the voltage control oscillator 33 used for measurement has a frequency range of 30 MHz to 3 GHz.

The frequency-swept high frequency waves are passed through the directional coupler 34 and introduced to the plasma processing apparatus. The position and method in which the high frequency waves enter the plasma processing apparatus is arbitrary. For example, the high frequency waves can be introduced from the plasma-generating high frequency matching unit 17 through a filter transmitting only high frequency waves for measurement into the apparatus. The frequency-swept high frequency waves can also be introduced to the plasma processing apparatus from the high frequency matching unit 17 using a switch that is switched only during measurement. The frequency-swept high frequency waves can also be introduced to the plasma processing apparatus by disconnecting a connector disposed between the plasma-generating high frequency power supply 16 and the high frequency matching unit 17 to temporarily introduce the high frequency waves for measurement, or by disconnecting a connector disposed between the high frequency matching unit 17 and the high frequency electrode 13 to introduce the high frequency waves for measurement directly into the high frequency electrode 13. Further, the high frequency waves for measurement can also be introduced from a high frequency matching unit not shown in the transmission system of the RF bias high frequency power supply 19 applied to the wafer 7.

The high frequency waves for measurement introduced from the high frequency matching unit 17 are transmitted as incident waves 53a to the electrode supporting member 14 and the high frequency electrode 13, and transmitted as incident waves 53b through the vacuum window 12 into the processing chamber 10. The incident waves 53c radiated into the processing chamber 10 are transmitted to various directions in the processing chamber 10, but since no plasma exists in the processing chamber 10 that absorbs high frequencies, the high frequency waves for measurement are reflected at various locations such as the surfaces of the high frequency electrode 13, the vacuum window 12 and the wafer 7, generating reflected waves 54c, 54b and 54a. At this time, since the frequency of the high frequency waves for measurement changes temporally, the high frequency waves for measurement generate standing waves at frequencies that induce resonance of reflected waves at various locations, causing the reflected waves to be reduced.

The reflected waves from the plasma processing apparatus pass through the directional coupler 34 of the measurement device unit 3, in which only the reflected waves Vr are separated, enabling the reflected wave power Pr to be detected by the detector 35. The detected data is processed by the measurement data processing unit 36.

As described, the high frequency waves Vin for measurement have a frequency f that changes temporally in proportion to the output voltage Vf of the waveform generator 32, and the frequency spectrum of the reflected wave power can be obtained by showing the frequency f corresponding to the output voltage of the waveform generator 32 on the horizontal axis and the reflected wave power Pr on the vertical axis. At this time, the power introduced to the vacuum processing chamber of the plasma processing apparatus is normally reflected 100 percent, but at a frequency place inducing resonance in the plasma processing apparatus, the reflected power is reduced and an absorption spectrum is generated in the frequency spectrum of the reflected power (return loss), in which the reflected power Pr becomes minimum.

The information on the pattern of the spectrum shape and the data on the frequency that generates absorption spectrum obtained from the frequency spectrum of the detected reflected wave power are stored as data representing the status of the plasma processing apparatus in a database not shown in the measurement control unit 31, which is monitored so as to monitor the change in status of the plasma processing apparatus, and when the change exceeds a reference value, an alarm can be output to notify defect of the plasma processing apparatus.

Figure 2:
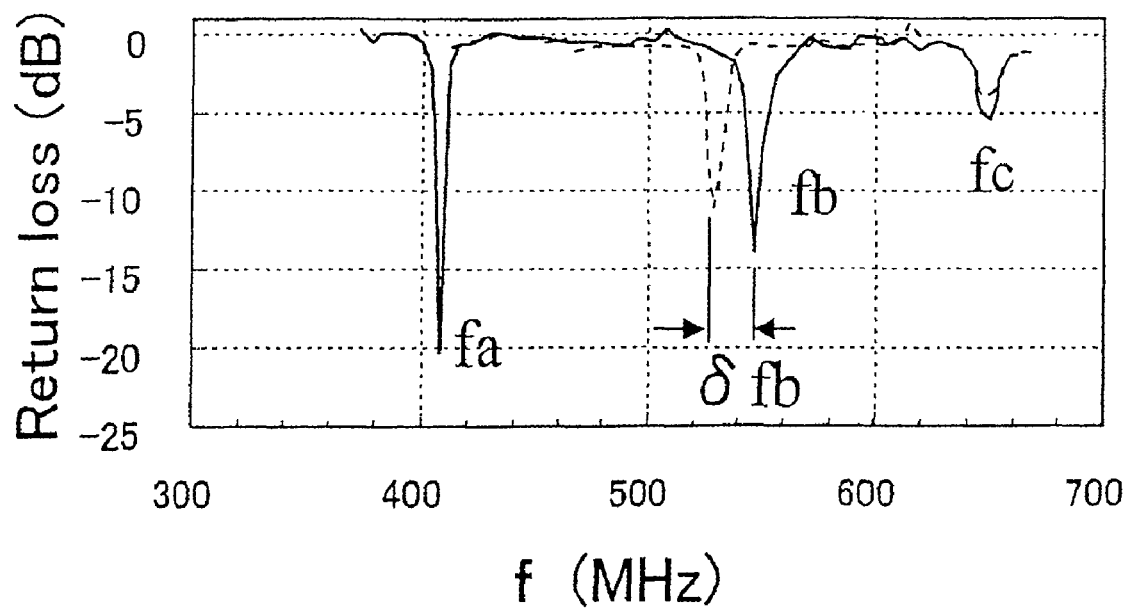
FIG. 2 is an explanatory view showing an example of an absorption spectrum, or frequency spectrum pattern, of the result of measurement according to the present invention.

An example of the measurement result is shown in FIG. 2. FIG. 2 is a drawing showing an example of the frequency spectrum of reflected power loss (return loss). This drawing shows an example having major absorption spectrums at three places, which are referred to as fa (approximately 410 MHz), fb (approximately 550 MHz) and fc (approximately 650 MHz). In FIG. 2, the solid line represents the result of measurement when the processing apparatus is at a normal state, and the dashed line represents the result of measurement with the wafer supporting unit raised from the normal state so that the position of the wafer 7 is raised for 30 mm. The three frequency places of the absorption spectrum show that the high frequency for measurement induces resonance in the processing apparatus. It can be seen from the dashed line of FIG. 2 that only frequency fb is shifted for δfb, and the shift δfb of the resonance frequency fb is a resonance phenomenon that is caused by the displacement of the electrode position.

Figure 3:
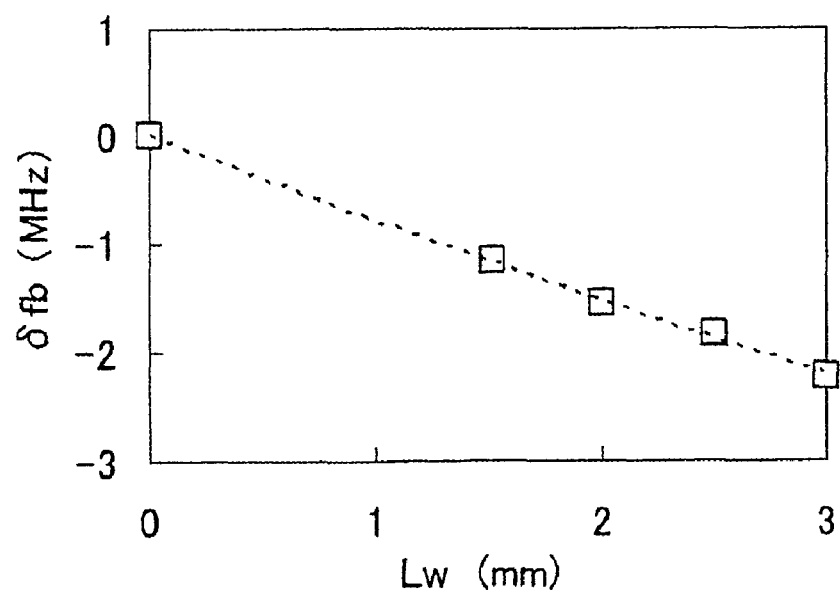
FIG. 3 is an explanatory view showing the relationship between the change in status of the plasma processing apparatus and the absorption spectrum frequency shift according to the present invention when the height of the wafer supporting unit is varied.
Figure 4:
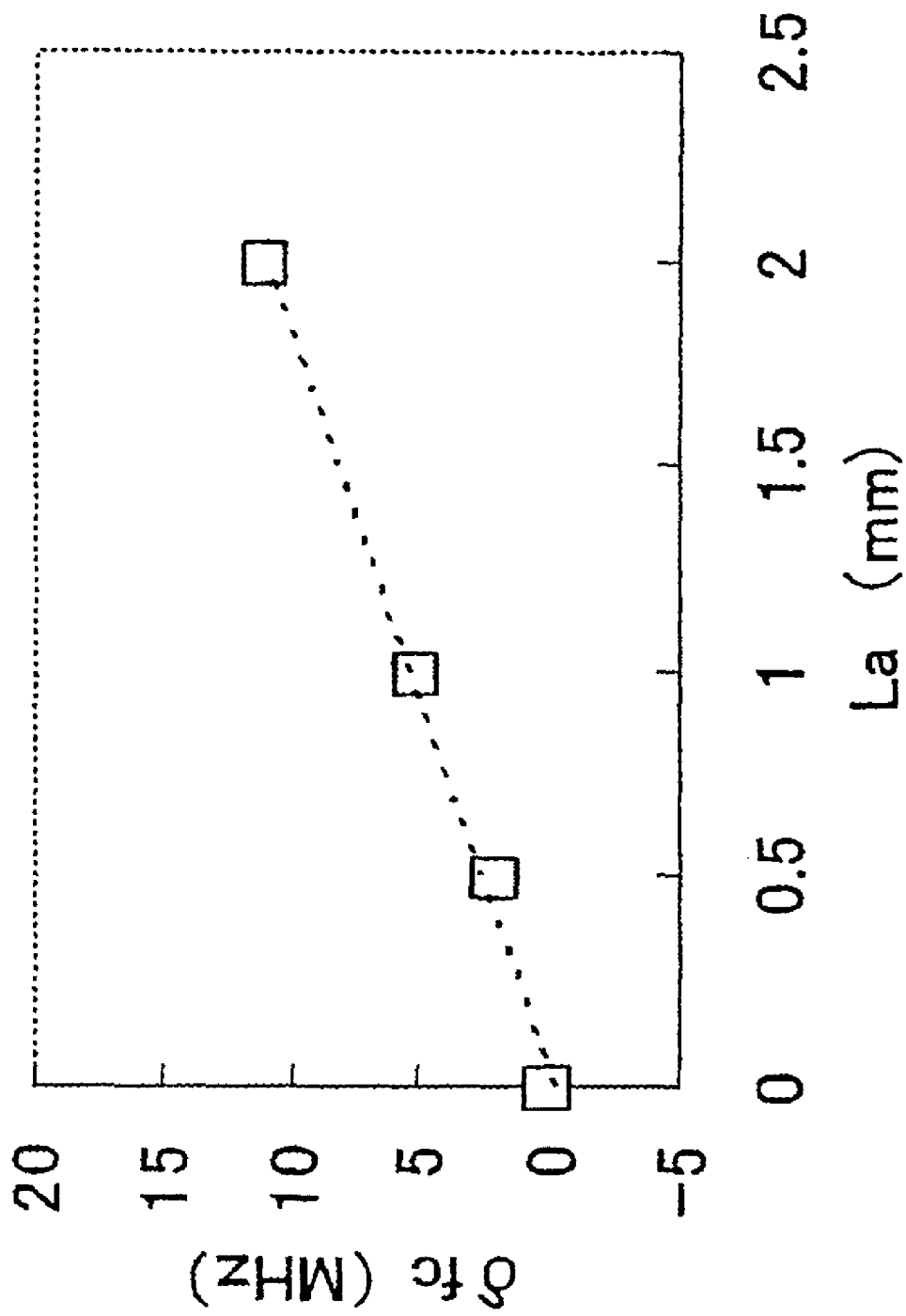
FIG. 4 is an explanatory view showing the relationship between the change in status of the plasma processing apparatus and the absorption spectrum frequency shift according to the present invention when the clearance between the high frequency electrode and the electrode supporting member is varied.

The relationship between the absorption spectrum and the change in status of the plasma processing apparatus is described with reference to FIGS. 3 and 4. FIG. 3 shows the measurement result of the shift quantity of the resonance frequency when the height of the wafer supporting unit is changed for Lw (mm). FIG. 4 shows the measurement result of the shift quantity of the resonance frequency when a clearance La (mm) is created by loosening the screw between the high frequency electrode 13 and the electrode supporting member 14. As a result, it has been discovered that when the height of the wafer supporting unit is reduced for 3 (mm), only the absorption spectrum fb is reduced in proportion for approximately 2 MHz. Further, with respect to the clearance La at the rear side of the high frequency electrode 13, it has been discovered that when the distance of the clearance La is enlarged for 2 (mm), only the absorption spectrum fc changes for approximately 10 MHz. As described, it has been discovered that frequency shift is caused to different absorption spectrums depending on the changed position, such as the change in position or defect of the components, caused in the plasma processing apparatus.

The above discovery can be used to enable the defective position to be identified easily when defect is found in the status of the plasma processing apparatus, by storing in advance as database the relationship between the change in major locations, or major components, and the frequency of the absorption spectrum.

Figure 5:
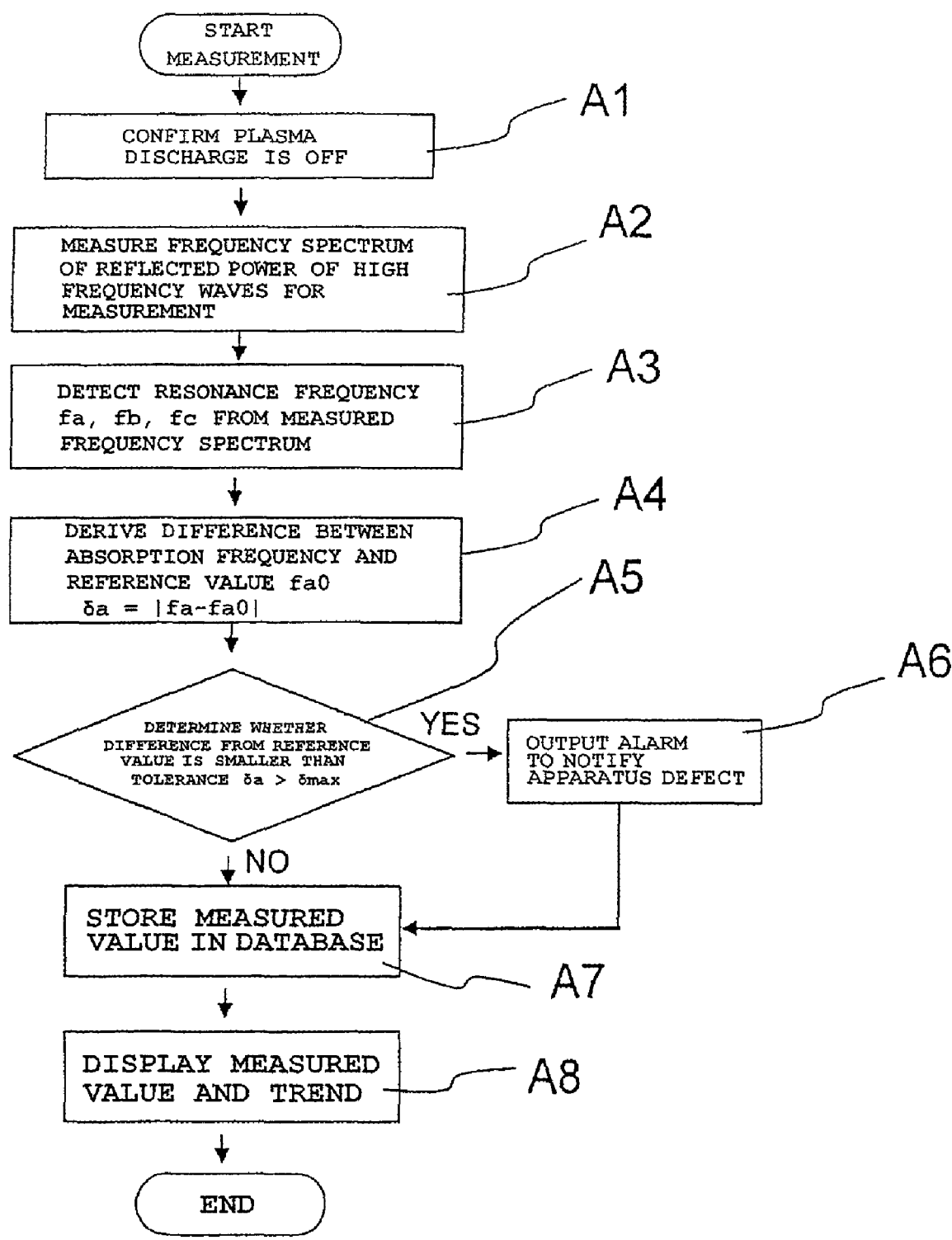
FIG. 5 is a flowchart showing the measurement method according to the present invention.

One example of the flow for monitoring the status of the plasma processing apparatus according to the present embodiment is described with reference to FIG. 5. The status of the plasma processing apparatus can be monitored for example by performing arbitrary measurement via operation using a control panel of the plasma processing apparatus, or by automatic measurement performed periodically in a mass-production line. In the measurement example of FIG. 4, based on the order to start measurement, it is first confirmed that plasma discharge is off (A1), and the high frequency waves for measurement is radiated in the vacuum processing chamber of the plasma processing apparatus to measure the frequency spectrum data of the reflected waves (A2). Based on the measured frequency spectrum data, a plurality of absorption spectrum frequencies (fa, fb, fc) in which the reflection wave power becomes minimum are computed (A3). Then, the variation δa from the reference value fa0 of the frequency of the respective absorption spectrums is computed using the computed absorption spectrum frequencies (fa, fb, fc) (A4).

The computed result is stored as database shown for example in FIG. 6 in a storage means, and used for monitoring the history of variation of the status of the plasma processing apparatus.

The database of FIG. 6 records the measured value of frequencies fa and fb of absorption spectrums that are to be observed and the magnitude of the frequency change δfa and δfb from the reference values fa0 and fb0 per every measurement time t1, t2 and so on, and also stores the tolerance δfa max and δfb max of the magnitude of frequency change.

Now, with reference again to FIG. 5, the computed magnitude of frequency change δa is compared with the tolerance δmax (A5). When the magnitude of frequency change δa exceeds the tolerance δmax, a warning is output to notify defect of the plasma processing apparatus (A6). If in A5 the frequency change is equal to or below the tolerance δmax, the measurement value fa is stored in the database (A7). Thereafter, the measurement value stored in the database and the trend of the measurement value is displayed on the control panel of the plasma processing apparatus to indicate the status of the apparatus (A8), and the process is ended.

Figure 7:
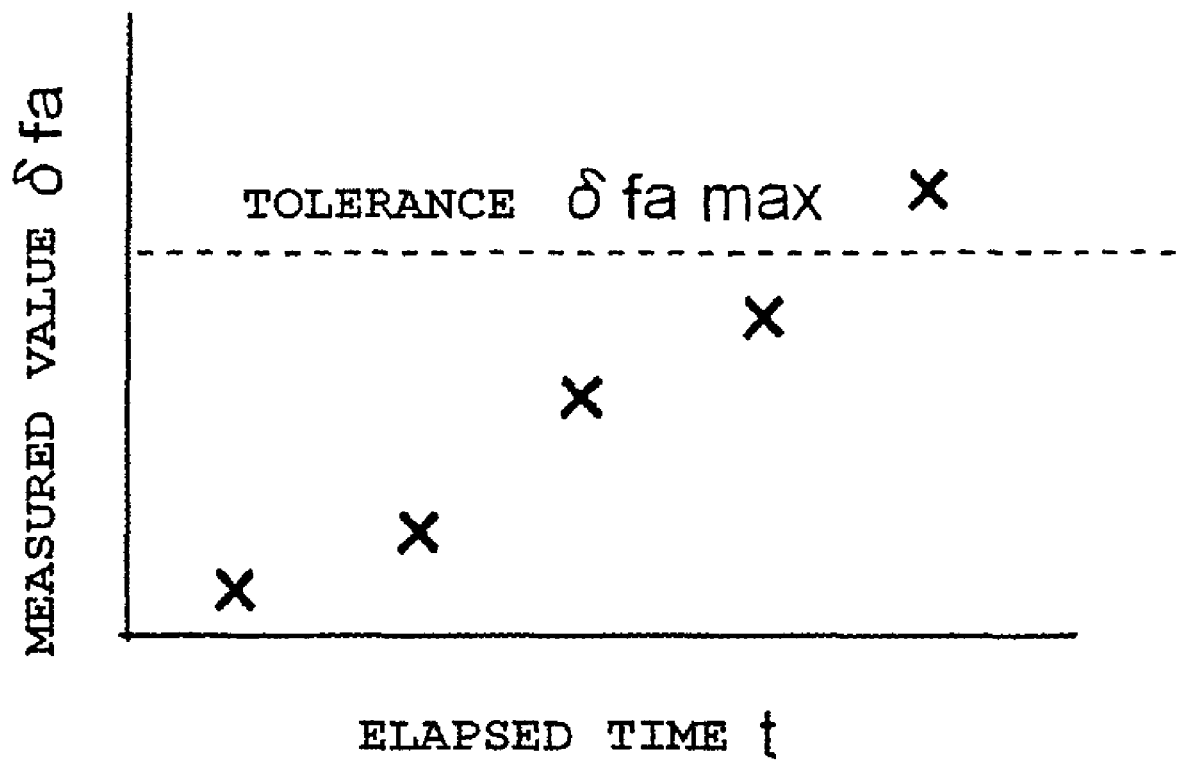
FIG. 7 is an explanatory view showing the history of acquisition of the measurement results according to the present invention.

As shown in FIG. 7, this process is performed at given time intervals to acquire the measurement value δfa over time, and to determine whether the value exceeds the tolerance δfa max. This time interval can be set so that the value is acquired at least each time when the plasma processing of a single sample is completed.

Embodiment 2

The outline of the arrangement of a plasma processing apparatus according to a second embodiment of the present invention will be described with reference to FIG. 8. The plasma processing apparatus in the present embodiment is an inductively-coupled plasma processing apparatus.

Figure 8:
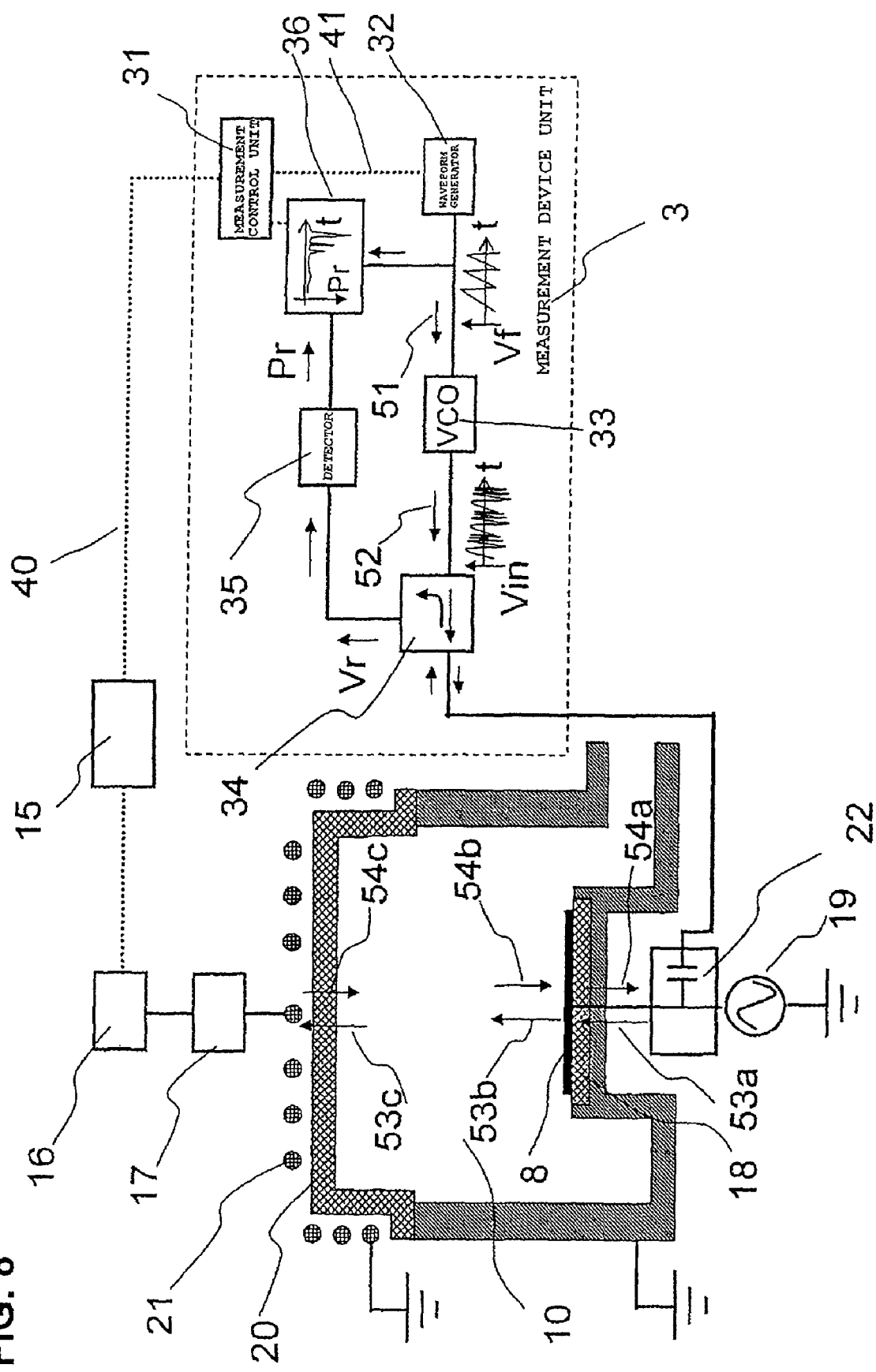
FIG. 8 is an explanatory view showing the outline of the arrangement of the plasma processing apparatus according to a second embodiment of the present invention.

According to the embodiment of FIG. 8, the inductively-coupled plasma processing apparatus includes a vacuum processing chamber 10 formed within a casing (vacuum reactor), a processing apparatus control unit 15, a plasma-generating high frequency power supply 16, a high frequency matching unit 17, an electrostatic chuck (attraction electrode as high frequency transmission means) 18, an RF bias high frequency power supply 19, a vacuum means not shown, an insulating vacuum window 20, a high frequency coil 21, a high frequency matching unit 22, and a measurement device unit 3.

A substrate to be processed (wafer) 7 is attracted and held on the electrostatic chuck 18. A connector not shown can be arranged between the plasma-generating power supply 16 and the high frequency matching unit 17 or between the high frequency matching unit 17 and the high frequency coil 21.

The measurement device unit 3 includes a measurement control unit 31, a low-frequency waveform generator (sawtooth wave generator) 32, a voltage control oscillator (VCO) 33, a directional coupler 34, a detector 35, a measurement data processing unit 36, and a data recording means (database) not shown.

Since there is no high frequency electrode for introducing the high frequency waves for measurement at the upper area of the vacuum processing chamber 10, a filter or switch for introducing high frequency waves for measurement is disposed on the high frequency matching unit 22 of the RF bias high frequency power supply 19 for supporting and applying high frequency waves to the wafer 7. The incident waves 53a having been introduced through the wafer 7 are propagated in the processing chamber 10 as incident waves 53b and reflected waves 54b to form standing waves, and also transmitted through the insulating vacuum window 20 as incident waves 53c and reflected waves 54c to the inductively-coupled high frequency coil 21, reaching the high frequency matching unit 17 and the high frequency power supply 16, inducing resonance having specific frequencies at various locations.

The processes in the measurement device unit 3 are performed in a similar manner as the first embodiment.

Since the high frequency waves for measurement 53 can easily be transmitted to the high frequency coil 21 by setting a wide frequency range, the failure of the mounting status of the high frequency coil 21 can also be monitored.

Figure 9:
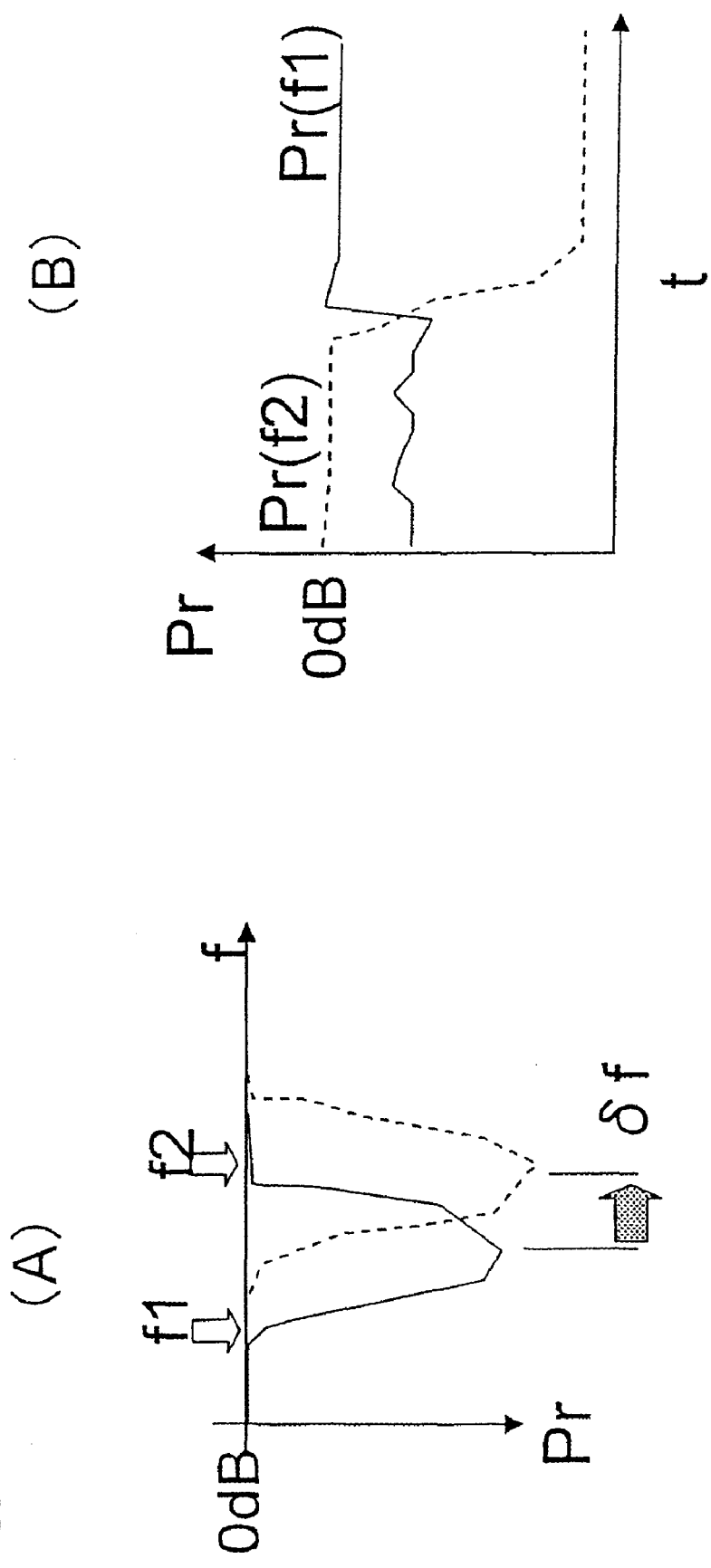
FIG. 9 is an explanatory view showing the method for detecting the frequency variation of the absorption spectrum according to the second embodiment of the present invention.

An example of a means for easily detecting the frequency change of the absorption spectrum in an inexpensive arrangement in the first and second embodiments of the present invention will now be described with reference to FIG. 9. A detecting method of a case where the frequency of the reflected power is varied from the waveform shown in the solid of FIG. 9(A) to the waveform shown in the dashed line will be described. In this case, at least two frequencies, frequency f1 and frequency f2, are set as the measurement frequency range of the absorption spectrum of FIG. 9(A), and the reflected wave power of the respective frequencies is detected. If the frequency of the absorption spectrum is shifted for δf from the solid line to the dashed line, the reflected wave powers Pr (f1) and Pr (f2) of the respective frequencies f1 and f2 can be detected as time variation shown in FIG. 9(B) representing the change in reflected power of each frequency.

Figure 10:
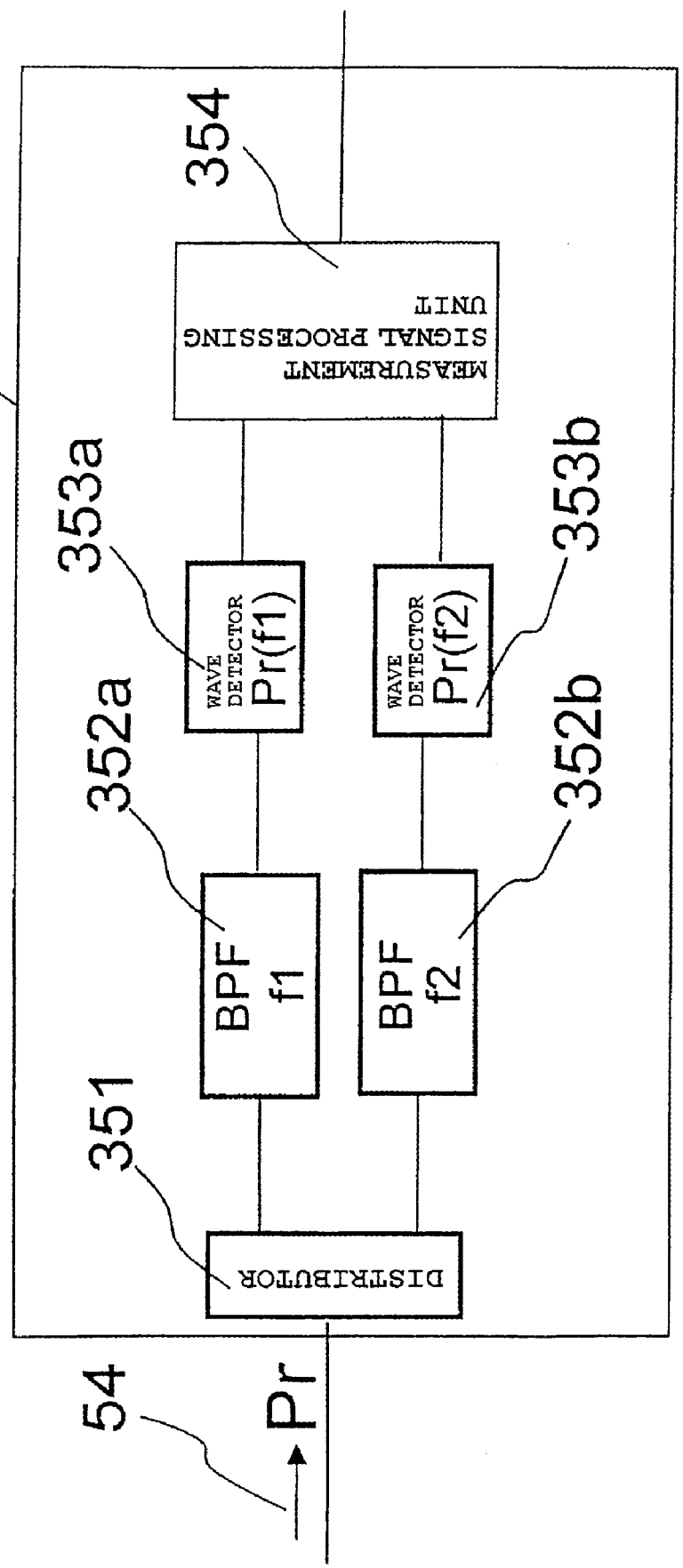
FIG. 10 is an explanatory view showing the arrangement of a detector for detecting frequency variation of the absorption spectrum according to the second embodiment of the present invention.

An actual example of the detector 25 according to the second embodiment will be shown in FIG. 10. The detector 35 includes a distributor 351, bandpass filters 352a and 352b, wave detectors 353a and 353b, and a measurement signal processing unit 354, which are respectively connected as shown in the drawing.

The reflected waves (Pr) 54 from the plasma processing apparatus are distributed in the distributor 351 to two or more band pass filters 352a and 352b, and the output from each band pass filter 352a and 352b is detected respectively by wave detectors 353a and 353b, to thereby detect the respective frequency components of the reflected wave power.

The signals of the respective frequency components (Prf1 and Prf2) are processed via the measurement signal processing unit 354 and stored in the database as data representing the time variation of the reflected wave power of the respective frequency components as shown in FIG. 9(B), and when the signal variation exceeds a tolerance set for the signal variation, a warning signal is transmitted to the control unit of the plasma processing apparatus.

The plasma processing apparatus of the present invention is applicable to various types of plasma generating systems. Further, the present invention is also applicable for monitoring the change in status of a plasma processing apparatus having metallic reactors or high-frequency propagation paths through which high frequency for measurement can be introduced if reflected waves are detectable.

What is claimed is:

1. A plasma processing apparatus having a vacuum processing chamber and a plasma generating means for generating plasma in the vacuum processing chamber for subjecting a sample placed in the vacuum processing chamber to plasma processing, comprising:
    a frequency spectrum measurement means for measuring the frequency spectrum of a reflected power of an electromagnetic wave reflected from the vacuum processing chamber, wherein the frequency spectrum measurement means includes:
    an electromagnetic wave generating means for generating a frequency-swept electromagnetic wave having weak power so as not to cause plasma discharge in the vacuum processing chamber;
    an electromagnetic wave supplying means for supplying the electromagnetic wave from the electromagnetic wave generating means into the vacuum processing chamber having no plasma generated therein; and
    a reflected power detecting means for detecting the frequency spectrum of reflected power of the electromagnetic wave reflected from the vacuum processing chamber;
    wherein the frequency spectrum measurement means comprises:
    a storage means for storing a frequency spectrum pattern of the reflected power measured in advance by the frequency spectrum measurement means for reflected power as a reference of the change in status of the plasma processing apparatus unique to the plasma processing apparatus;
    a determination means for determining defect of the plasma processing apparatus based on the difference between the reference and the newly-measured frequency spectrum pattern of the reflected power; and
    a display means for displaying the result determined by the determination means.

2. The plasma processing apparatus according to claim 1, wherein
    the frequency spectrum measurement means comprises a directional coupling circuit for supplying the electromagnetic wave from the electromagnetic wave generating means to a means for supplying high frequency power for generating plasma into the vacuum processing chamber, and for supplying the electromagnetic wave reflected from the vacuum processing chamber to the reflected power detecting means.

3. The plasma processing apparatus according to claim 1, wherein
    the frequency spectrum measurement means comprises a directional coupling circuit for radiating a weak electromagnetic wave for measurement from the electromagnetic wave generating means into the vacuum processing chamber through a high frequency transmission unit applied to the sample, and for supplying the reflected electromagnetic wave from the vacuum processing chamber to the reflected power detecting means.

4. The plasma processing apparatus according to claim 1, wherein
    the storage means stores at least one frequency value of a plurality of frequency values in which a reflected power of the frequency spectrum data of the reflected power measured in advance by the frequency spectrum measurement means for reflected power becomes minimum as a reference of the change in status of the plasma processing apparatus unique to the plasma processing apparatus; and
    the determination means determines change in status of the plasma processing apparatus or defect of the plasma processing apparatus based on the difference obtained by comparing a newly-measured frequency spectrum data with the frequency spectrum data stored in the storage means.

5. The plasma processing apparatus according to claim 1, wherein
    the frequency spectrum measurement means comprises:
    an input means for inputting frequency spectrum data measured in another plasma processing apparatus; and
    a discrimination means for discriminating an individual variability of the present plasma processing apparatus and another plasma processing apparatus by comparing the frequency spectrum data stored in the storage means as reference of the status of the apparatus unique to the present plasma processing apparatus and the frequency spectrum data measured in the another plasma processing apparatus input via the input means.

6. The plasma processing apparatus according to claim 1, wherein
    the electromagnetic wave generating means of the frequency spectrum measurement means is composed of a voltage control oscillator (VCO).

7. The plasma processing apparatus according to claim 1, wherein
    the frequency spectrum measurement means is composed of a network analyzer.

8. A plasma processing apparatus having a vacuum processing chamber and a plasma generating means for generating plasma in the vacuum processing chamber for subjecting a sample placed in the vacuum processing chamber to plasma processing, comprising:
    a frequency spectrum measurement means for measuring the frequency spectrum of a reflected power of an electromagnetic wave reflected from the vacuum processing chamber, wherein the frequency spectrum measurement means includes:
    an electromagnetic wave generating means for generating a frequency-swept electromagnetic wave having weak power so as not to cause plasma discharge in the vacuum processing chamber;

an electromagnetic wave supplying means for supplying the electromagnetic wave from the electromagnetic wave generating means into the vacuum processing chamber having no plasma generated therein; and a reflected power detecting means for detecting the frequency spectrum of reflected power of the electromagnetic wave reflected from the vacuum processing chamber;

wherein the frequency spectrum measurement means comprises:

a storage means for storing data of a frequency spectrum pattern or a plurality of frequency values in which reflected power becomes minimum of the reflected power measured in advance by the frequency spectrum measurement means while creating a state in which a component of the plasma processing apparatus is consumed or is provided with a predicted tolerance variation; and a means for specifying the component causing the change in status of the apparatus by verifying the change in pattern of the newly-measured frequency spectrum data with the stored data stored in the storage means.

9. A plasma processing apparatus having a vacuum processing chamber and a plasma generating means for generating plasma in the vacuum processing chamber for subjecting a sample placed in the vacuum processing chamber to plasma processing, comprising:

a frequency spectrum measurement means for measuring the frequency spectrum of a reflected power of an electromagnetic wave reflected from the vacuum processing chamber, wherein the frequency spectrum measurement means includes:

an electromagnetic wave generating means for generating a frequency-swept electromagnetic wave having weak power so as not to cause plasma discharge in the vacuum processing chamber;

an electromagnetic wave supplying means for supplying the electromagnetic wave from the electromagnetic wave generating means into the vacuum processing chamber having no plasma generated therein; and a reflected power detecting means for detecting the frequency spectrum of reflected power of the electromagnetic wave reflected from the vacuum processing chamber;

wherein the frequency spectrum measurement means comprises:

a data acquisition means for acquiring data of a frequency spectrum pattern or a plurality of frequency values in which reflected power becomes minimum of the reflected power measured in advance by the frequency spectrum measurement means either arbitrarily via control from a control unit of the plasma processing apparatus or periodically, and a storage means for storing the acquired data of a frequency spectrum pattern of the reflected power or a plurality of frequency values in which reflected power becomes minimum as database.

10. A plasma processing apparatus having a vacuum processing chamber and a plasma generating means for generating plasma in the vacuum processing chamber for subjecting a sample placed in the vacuum processing chamber to plasma processing, comprising:

a frequency spectrum measurement means for measuring the frequency spectrum of a reflected power of an electromagnetic wave reflected from the vacuum processing chamber, wherein the frequency spectrum measurement means includes:

an electromagnetic wave generating means for generating a frequency-swept electromagnetic wave having weak power so as not to cause plasma discharge in the vacuum processing chamber;

an electromagnetic wave supplying means for supplying the electromagnetic wave from the electromagnetic wave generating means into the vacuum processing chamber having no plasma generated therein; and a reflected power detecting means for detecting the frequency spectrum of reflected power of the electromagnetic wave reflected from the vacuum processing chamber;

wherein a first connector is arranged between a high frequency power supply for generating plasma in the plasma processing apparatus and a high frequency transmission unit to the vacuum processing chamber; and wherein the frequency spectrum measurement means comprises a second connector to be engaged with the first connector on the side close to the high frequency transmission unit, wherein during measurement of the frequency spectrum of reflected power, the engagement of the high frequency power supply-side and the high frequency transmission unit-side of the first connector is disengaged, and the second connector is engaged with the high frequency transmission unit-side of the first connector so as to radiate weak electromagnetic wave for measurement into the vacuum processing chamber.

11. A plasma processing apparatus having a vacuum processing chamber and a plasma generating means for generating plasma in the vacuum processing chamber for subjecting a sample placed in the vacuum processing chamber to plasma processing, comprising:

a frequency spectrum measurement means for measuring the frequency spectrum of a reflected power of an electromagnetic wave reflected from the vacuum processing chamber, wherein the frequency spectrum measurement means includes:

an electromagnetic wave generating means for generating a frequency-swept electromagnetic wave having weak power so as not to cause plasma discharge in the vacuum processing chamber;

an electromagnetic wave supplying means for supplying the electromagnetic wave from the electromagnetic wave generating means into the vacuum processing chamber having no plasma generated therein; and a reflected power detecting means for detecting the frequency spectrum of reflected power of the electromagnetic wave reflected from the vacuum processing chamber;

wherein a first connector is arranged between a high frequency power supply for applying high frequency to a sample to be processed in the plasma processing apparatus and a high frequency transmission unit to the vacuum processing chamber; and wherein the frequency spectrum measurement means of reflected power comprises a second connector to be engaged with the first connector on the side close to the high frequency transmission unit, wherein during measurement of the frequency spectrum of reflected power, the engagement of the high frequency power supply-side and the high frequency transmission unit-side of the first connector is disengaged, and the second connector is engaged with the high frequency transmission unit-side of the first connector so as to radiate weak electromagnetic wave for measurement into the vacuum processing chamber.

12. A method for detecting status of a plasma processing apparatus for subjecting a sample placed in the vacuum processing chamber to plasma processing, comprising a vacuum processing chamber, a plasma generating means, and a frequency measurement means for emitting a frequency-swept electromagnetic wave having weak power that does not cause plasma discharge in the vacuum processing chamber and measuring the frequency spectrum of reflected power from the vacuum processing chamber, the method comprising:
- a step of radiating the frequency-swept electromagnetic wave having weak power that does not cause plasma discharge in the vacuum processing chamber in a state where no plasma is generated in the vacuum processing chamber;
- a step of acquiring frequency spectrum data of reflected power by measuring the frequency spectrum of the reflected power of the electromagnetic wave reflected from the vacuum processing chamber; and
- a step of comparing a frequency spectrum data unique to the plasma processing apparatus acquired in advance with the newly-acquired frequency spectrum data in order to determine the status of the plasma processing apparatus.

* * * * *